United States Patent [19]
Gregor

[11] Patent Number: 5,084,637
[45] Date of Patent: Jan. 28, 1992

[54] BIDIRECTIONAL LEVEL SHIFTING INTERFACE CIRCUIT

[75] Inventor: Roger P. Gregor, Endicott, N.Y.

[73] Assignee: International Business Machines Corp., Armonk, N.Y.

[21] Appl. No.: 358,321

[22] Filed: May 30, 1989

[51] Int. Cl.$^5$ ............... H03K 19/092; H03K 19/094; H04B 1/38; H04L 25/02
[52] U.S. Cl. ................................. 307/475; 307/241; 307/243; 307/481; 375/7
[58] Field of Search ............... 307/475, 571, 242, 555, 307/542.1, 268, 471, 480, 241, 448, 243, 264; 340/825, 79, 146.2, 825.51, 825.52, 825.2, 825.62; 371/16.1, 16.4, 11.3; 365/233, 189.11; 455/51, 89, 99, 126, 127, 79; 375/7, 17–19

[56] References Cited

U.S. PATENT DOCUMENTS

| | | | |
|---|---|---|---|
| 3,675,144 | 7/1972 | Zuk | 330/40 |
| 3,755,690 | 8/1973 | Smith | 307/205 |
| 3,867,699 | 2/1975 | Stoffer | 455/86 X |
| 3,938,109 | 2/1976 | Gionis et al. | 307/475 X |
| 4,216,390 | 8/1980 | Stewart | 307/264 |
| 4,473,760 | 10/1984 | Ambrosius, III et al. | 307/481 |
| 4,479,067 | 10/1984 | Fujita | 307/475 |
| 4,490,633 | 11/1984 | Noufer et al. | 307/475 |
| 4,494,018 | 1/1985 | Clemen et al. | 307/482 |
| 4,501,978 | 2/1985 | Gentile et al. | 307/475 |
| 4,502,027 | 2/1985 | Ayasli | 307/241 X |
| 4,506,164 | 3/1985 | Higuchi | 307/264 |
| 4,628,480 | 12/1986 | Floyd | 365/233 X |
| 4,656,373 | 4/1987 | Plus | 307/475 |
| 4,672,243 | 6/1987 | Kirsch | 307/475 |
| 4,697,108 | 9/1987 | Chappell et al. | 307/475 |
| 4,713,827 | 12/1987 | Lauffer et al. | 455/79 X |
| 4,756,006 | 7/1988 | Rickard | 375/7 |
| 4,807,249 | 2/1989 | Lang et al. | 375/7 |
| 4,912,724 | 3/1990 | Wilson | 375/7 |
| 4,920,285 | 4/1990 | Clark et al. | 307/571 |

Primary Examiner—Stanley D. Miller
Assistant Examiner—David R. Bertelson
Attorney, Agent, or Firm—Arthur J. Samodovitz

[57] ABSTRACT

A bidirectional level shifting interface circuit has first and second I/O ports and an FET with a drain-source channel connected between the first and second I/O ports. The first I/O port is connected to an I/O port of a first digital circuit operating at a relatively low supply voltage, and the second I/O port is connected to an I/O port of a second digital circuit operating at a relatively high supply voltage. This channel passes communication signals in each direction between the first and second digital circuit. A latching circuit comprising a P Channel FET is biased by the relatively high voltage supply, has an output connected to the second I/O port, and has a control input. The interface circuit further comprises an inverter circuit having a control input connected to the second I/O port and an inverted output connected to the control input of the latching FET such that when the second I/O port exhibits a binary one voltage caused by the first digital circuit, the inverted output exhibits a binary zero voltage to activate the P Channel FET to latch the second I/O port at sufficient voltage to drive the second digital circuit at binary one level.

21 Claims, 1 Drawing Sheet

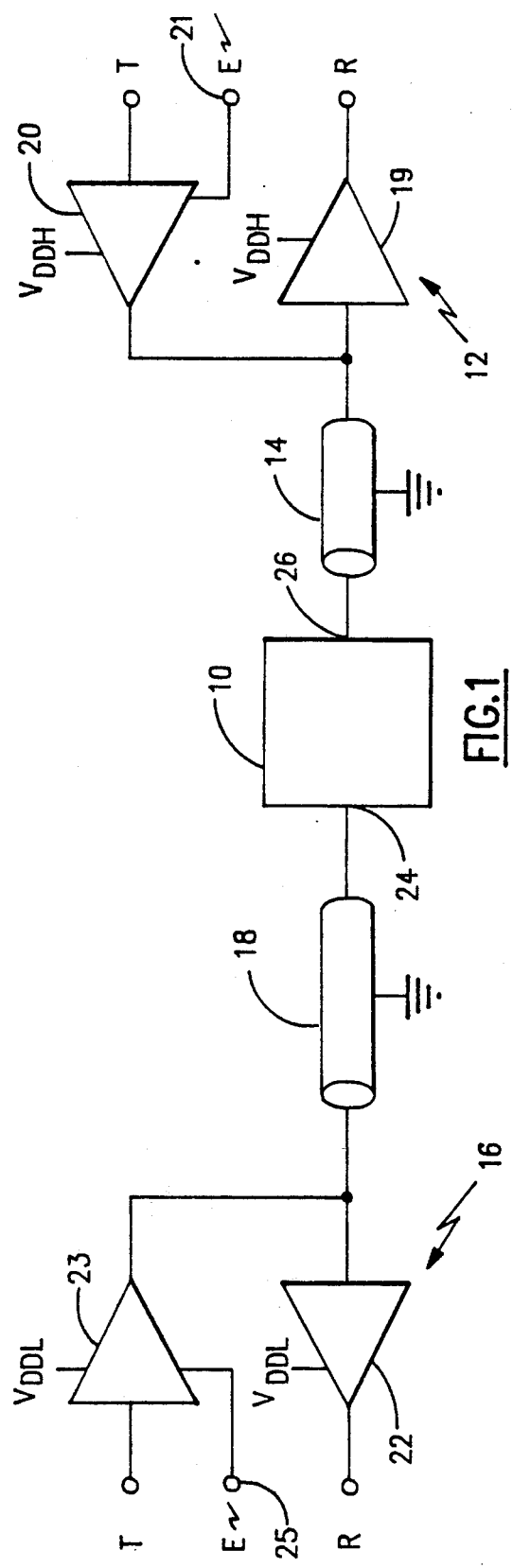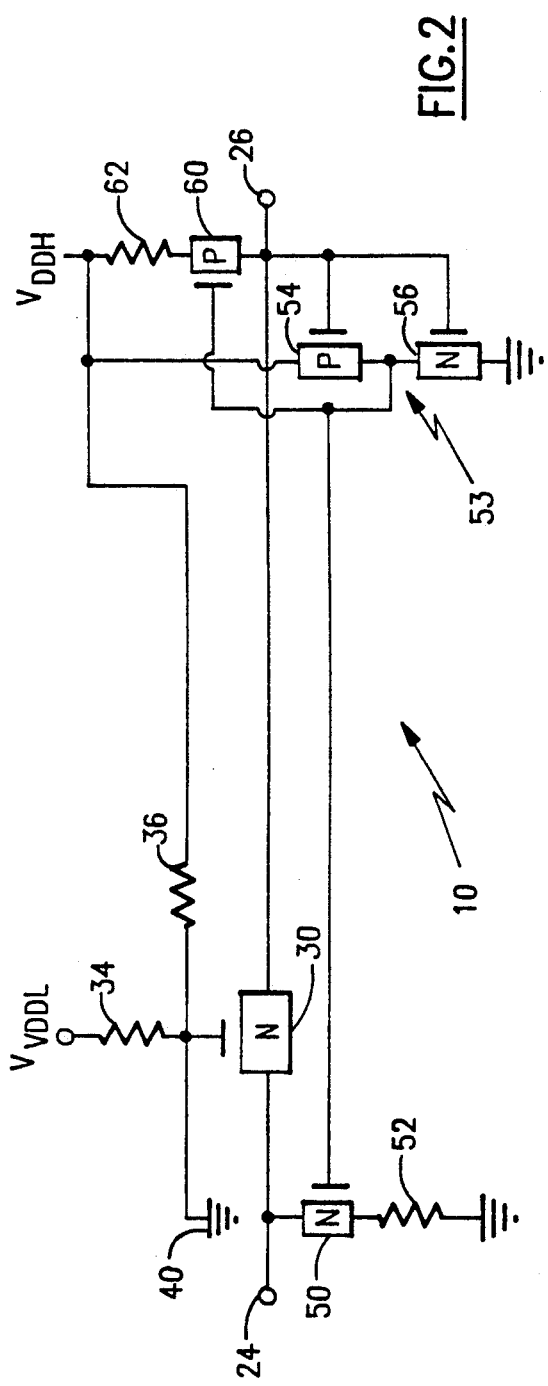

BIDIRECTIONAL LEVEL SHIFTING INTERFACE CIRCUIT

BACKGROUND OF THE INVENTION

The invention relates generally to electronic interface circuits and deals more particularly with a bidirectional level shifting interface circuit for use between two different digital circuits operating at different voltage levels.

Many systems utilize two different circuit technologies which operate with a common ground (binary zero level) but different binary one or high voltage levels. Such circuits require an interface to permit bidirectional communication between the two circuits. For example, new CMOS technology operates at lower voltage than older CMOS technologies to improve performance and density. However, it may be advantageous in some applications to provide in one system a combination of both technologies. In such a system, each printed circuit board or other circuit carrying card typically contains only one technology and is connected by a transmission line to another board or card containing a different technology. If one of the CMOS technologies operates between 3.4 volts and ground and the other operates between 5 volts and ground, a 3.4 volt binary one signal from the first technology cannot reliably drive the second technology. This is because the second technology can have a maximum 3.1 volt threshold and there are losses in greater margin of drive voltage. Also, if a 5 volt signal were applied directly to the 3.4 volt receiver, the 5 volt signal could breakdown the 3.4 volt receiver. Thus, an interface is required to drive the respective receiving circuit with a proper voltage level.

Heretofore it was known to provide a level shifting transceiver between the two circuit boards to provide the appropriate voltage for each technology and a non-level shifting transceiver at the I/O of each circuit. Such a level shifting transceiver comprises two buffer gates connected in opposite directions back-to-back, and an inverter gate to enable one buffer gate while disabling the other (to provide a high impedance output) depending on the direction of communication. One of the buffer gates was biased at the 5 volt level and the other buffer gate was biased at the 3.4 voltage level. However, there are problems with such a level shifting transceiver because it requires a separate enable signal and adds a propagation delay through the respective buffer gate.

U.S. Pat. No. 4,216,390 to Stewart discloses a unidirectional level shifting circuit which comprises an N Channel FET. A source of the FET Channel is connected to first relatively low voltage digital circuit via a first inverter circuit, and a drain of the FET Channel is connected to a second relatively high voltage digital circuit via a second inverter circuit. Thus, a relatively low voltage, binary one communication signal of the first digital circuit passes through the first inverter circuit, the channel of the FET and the second inverter circuit to the output of the level shifting circuit. This output is also connected to an input of a first latch and the output of the first latch is connected to the input of the second inverter circuit. Thus, when the relatively low voltage binary one signal passes to the output of the level shifting circuit, it is latched to the relatively low voltage. This level shifting circuit also includes another FET which has its source connected to the high voltage supply and its drain to the second inverter. This FET is activated by a separate enable signal to deliver the relatively high voltage to the output of the level shifting circuit via the second inverter after the relatively low voltage passes to the output of the level shifting circuit.

A general object of the present invention is to provide a bidirectional level shifting interface circuit for use between two different circuits operating at different voltage levels.

A more specific object of the present invention is to provide an interface circuit of the foregoing type which introduces a minimal propagation delay therethrough.

Another specific object of the present invention is to provide an interface circuit of the foregoing type which does not require an enable or other control signal to operate.

SUMMARY OF THE INVENTION

The invention resides in bidirectional level shifting interface circuit comprising first and second I/O ports and a first FET having a drain-source channel connected between the first and second I/O ports. The first I/O port is connected via a transmission line to a third I/O port of a first digital circuit operating at a relatively low supply voltage, and the second I/O port is connected via a transmission line to a fourth I/O port of a second digital circuit operating at a relatively high supply voltage. The drain-source channel passes communication signals in each direction between the first and second digital circuits. To pass binary zero signals, the FET serves in both directions in the current sinking path. To pass a binary one signal from the second digital circuit, the FET can clamp the binary one voltage to a level compatible with the first digital circuit. To pass a binary one signal from the first digital circuit, the relatively low voltage signal passes through the FET and doubles in magnitude at the receiver within the second digital circuit due to a high input impedance of the receiver relative to the characteristic impedance of the transmission line. Also, the interface circuit includes a latching circuit which is biased by the relatively high voltage supply, has an output connected to the second I/O port, and has a control input responsive to the voltage at the second I/O port, for latching the second I/O port at sufficient voltage to drive the second digital circuit at binary one level following the transmission of a binary one signal by said first digital circuit.

According to one feature of the invention, the latching circuit comprises a P Channel FET and the interface circuit further comprises an inverter circuit having a control input connected to the second I/O port and an inverted output connected to the gate of the P Channel FET. Consequently, when the second I/O port receives a reflection from the receiver of the second digital circuit, the inverted output exhibits a binary zero voltage to activate the P Channel FET and thereby latch the second I/O port at sufficient voltage to drive the second digital circuit at binary one level.

BRIEF DESCRIPTION OF THE FIGURES

FIG. 1 is a schematic, block diagram of an electronic system utilizing two different circuit technologies, a bidirectional level shifting interface circuit therebetween according to the present invention, and two transmission lines which connect the interface circuit to the two different circuits.

FIG. 2 is a detailed circuit diagram of the bidirectional level shifting interface circuit of FIG. 1.

DETAILED DESCRIPTION OF THE PREFERRED EMBODIMENTS

Referring now to the drawings in detail wherein like reference numerals indicate like elements throughout the several views, FIG. 1 illustrates a digital system comprising a first digital circuit 12, a second digital circuit 16, and a bidirectional level shifting interface circuit 10 in accordance with the present invention. Circuit 10 is interposed between the two digital circuits, and transmission lines 14 and 18 interconnect the interface circuit to digital circuits 12 and 16, respectively. Digital circuit 12 operates between a relatively high, binary one voltage $V_{DDH}$, for example, 5 volts, and ground, and digital circuit 16 operates between a relatively low binary one voltage $V_{DDL}$, for example 3.4 volts, and the same ground. In the aforesaid example, both digital circuits 12 and 16 utilize CMOS technology, and each includes a non-level shifting transceiver input/output (I/O) circuit.

The non-level shifting transceiver of circuit 12 comprises a transmitter 20, receiver 19, and input 21 to enable the transmitter only during transmission. When disabled, transmitter 20 exhibits a high impedance output to prevent loading of the transmission line. When enabled, transmitter 20 exhibits an output impedance which equals a characteristic impedance of transmission line 14. Both transmitter 20 and receiver 19 are biased with the relatively high supply voltage $V_{DDH}$ characteristic of circuit 12.

The transceiver of digital circuit 16 comprises a transmitter 23, a receiver 22 and an input 25 which is used to enable the transmitter only during transmission. When disabled, transmitter 23 exhibits a high impedance output to prevent loading of the transmission line, and when enabled, transmitter 23 exhibits an output impedance which is much less than the characteristic impedance of transmission line 18. By way of example, each of the transmission lines has a characteristic impedance of 80 ohms, and the output impedance of transmitter 23 when enabled is 20 ohms. Both transmitter 23 and receiver 22 are biased with the relatively low supply voltage $V_{DDL}$ characteristic of circuit 16.

FIG. 2 illustrates in detail the circuitry of interface circuit 10. Circuit 10 includes I/O ports 24 and 26 connected respectively to transmission lines 18 and 14. Circuit 10 further comprises N Channel FET 30 which channel is connected between and directly to ports 24 and 26 to pass communication signals in each direction between digital circuits 12 and 16 with minimal propagation delay. Experiments have revealed only a 0.9 nanosecond delay through the channel. Preferably, the channel is wide (for example 2000 micrometers) to minimize the on resistance such that the on resistance is much less than the characteristic impedance of transmission lines 14 and 18. For example, if each transmission line has a characteristic impedance of 80 ohms, the on resistance of the FET Channel should be approximately 10 ohms or less. The gate of FET 30 is biased to approximately $V_{DDL}$, the relatively low operating voltage of digital circuit 16. In the illustrated embodiment, the gate is biased to approximately 0.3 volts above the $V_{DDL}$ by a voltage divider comprising resistor 34 (for example 500 ohms) and resistor 36 (for example 2K ohms). Capacitor 40 (for example 10 picafarads), stabilizes the gate voltage. When either transmitter 20 or 23 is enabled and presents a binary zero or ground voltage at its output, the drain-source channel of FET 30 serves in the current sinking path to provide the necessary interface.

However, interface circuit 10 includes additional circuitry to assist in the current sinking function when either transmitter 20 or 23 is enabled and exhibits binary zero voltage. This additional circuitry includes N Channel FET 50 (having for example, an on resistance of 300 ohms) and a series resistor 52 (having for example 500 ohms), and an inverter circuit 53 connected between output port 26 and the gate of FET 50. Inverter circuit 53 comprises P Channel FET 54 and N Channel FET 56 having a common gate connection at port 26 and a common output connection to the gate of FET 50. Consequently, when either transmitter outputs binary zero (approximately ground) voltage, the output of inverter 53 is binary one and activates N Channel FET 50. The channel of FET 50 is connected to I/O port 24 (or optionally to I/O port 26) to assist transmitter 20 or transmitter 23 in sinking the binary zero current. Resistor 52 is large enough to permit subsequent transmission of a binary one signal.

When transmitter 20 outputs its binary one level signal, of approximately 4.0 volts, approximately one half that amount is transmitted along transmission line 14 due to the output impedance of transmitter 20. When the binary one signal reaches FET 30, there is a small loss in voltage due to the channel on-resistance of FET 30. Then, the binary one signal proceeds along transmission line 18 toward receiver 22. Transmitter 23 is disabled during transmission by transmitter 20. Consequently, the input impedance is the input impedance of receiver 22 which is very large, for example, several hundred thousand ohms. Consequently, the voltage at the input of receiver 22 doubles. This is due to the fact that the energy of the binary one signal transmitted along transmission line 18 is provided by a magnetic and an electric field, and at the input of receiver 22, all the energy of the magnetic field is converted to the electric field energy. In the aforesaid example, the doubling of the voltage at the input of receiver 22 yields approximately 4 volts which is more than enough voltage to provide the binary one signal with receiver 22 but not so much voltage to break down receiver 22.

Also, when the binary one signal from transmitter 20 reaches receiver 22, a reflection is caused due to the high input impedance of receiver 22. This reflection propagates back through the channel of FET 30 and triggers inverter 53. Inverter 53 outputs binary zero voltage to activate FET 60 and assist in driving receiver 22. The activation of FET 60 prevents multiple reflections of the binary one signal between the I/O ports of digital circuits 12 and 16. The channel of FET 60 is connected at one end to $V_{DDH}$ via resistor 64 and at the other end to I/O port 24. By way of example, the channel of FET 60 has an on-resistance of 100 ohms and resistor 64 is a 100 ohm resistor. FET 30 limits the voltage of the binary one signal which passes through its channel to a level below the gate voltage to prevent overdrive of receiver 22. It should also be noted that during the transmission of the binary one signal from transmitter 20, the input of inverter 53 is high, the output of inverter 23 is low, and consequently FET 50 is shut off to prevent loading of the binary one signal.

When transmitter 23 transmits a binary one level signal, most of this voltage (for example, 2.5 volts) is received by transmission line 18 due to the low output impedance of transmitter 23. This signal passes through the channel of FET 30 where it looses a small amount of energy due to the on-resistance of the channel. Then, the signal travels along transmission line 14 toward receiver 19. At this time, receiver 19 is enabled and transmitter 20 is disabled by an appropriate signal applied to gate 21. The signal doubles in amplitude at the input of receiver 19 due to the high input impedance of receiver 19 to approximately 4.0 volts to drive receiver 19. Because of the impedance miss match at the input of receiver 19, there is also a reflection toward interface circuit 10, which reflection activates inverter 53 to provide a binary zero signal at the output of inverter 53. This binary zero signal activates P Channel FET 60. Thus, the voltage output from port 26 is pulled-up and clamped to approximately $V_{DDH}$ to thoroughly drive receiver 19. It should be noted that the gate voltage of FET 30 prevents the voltage at port 24 from exceeding $V_{DDL}$ to prevent reverse bias of transmitter 23 and breakdown of receiver 22.

In the illustrated embodiment, the threshold voltage of inverter 53 is greater than the voltage of the binary one signal transmitted by circuit 16 directly to I/O port 26. This makes it easier to deactivate inverter 53 when either transmitter transmits a binary zero signal. However, optionally, the threshold voltage of inverter 53 can be reduced such that the voltage of the binary one signal transmitted by transmitter 23 is sufficient to directly trigger inverter 53 to provide a binary zero output and thereby activate FET 60 to latch the output voltage (before the reflection is sensed by the input of inverter 53).

By way of example, resistors 62 and 52 can be designed with a minimum dimension printed polysilicon line so that if the printed dimension narrows due to process tolerances, the resistances of resistor 62 and resistor 52 will increase but the on resistance of FET 50 and FET 60 will decrease to compensate for the tolerance.

Based on the foregoing, a bidirectional level shifting interface circuit embodying the present invention has been disclosed. However, numerous modifications and substitutions can be made without deviating from the scope of the invention. For example, the interface circuit 10 can be biased by different binary one voltages other than the 3.4 volt $V_{DDL}$ and 5.0 volt $V_{DDH}$. Therefore, the invention has been disclosed by way of illustration not limitation, and reference should be made to the following claims to determine the scope of the invention.

I claim:

1. A bidirectional level shifting interface circuit comprising:
   first and second I/O ports;
   a first FET having a channel connected between said first and second I/O ports, said first I/O port being including means for coupling to a third I/O port of a first digital circuit operating at a relatively low power supply voltage, and said second I/O port being including means for coupling to a fourth I/O port of a second digital circuit operating at a relatively high power supply voltage, said channel passing communication signals in each direction between said first and second digital circuits; and
   latching circuit means, biased by the relatively high voltage power supply, having an output connected to said second I/O port, and having a control input responsive to the voltage at said first or second I/O ports, for latching said second I/O port at sufficient voltage to drive said second digital circuit at binary one level in response to the transmission by said first digital circuit of a binary one signal toward said second digital circuit via said first and second I/O ports.

2. An interface circuit as set forth in claim 1 wherein said latching circuit means comprises a P Channel FET and said control input is located at a gate of said P Channel FET and further comprising an inverter circuit having a control input connected to said second I/O port and an inverted output connected to said control input of said latching circuit means such that when said second I/O port exhibits a voltage greater than a threshold voltage of said inverter circuit caused by a binary one signal transmitted by said first digital circuit, said inverted output exhibits a binary zero voltage to activate said P Channel FET to latch said second I/O port at sufficient voltage to drive said second digital circuit at binary one voltage.

3. An interface circuit as set forth in claim 2 wherein said first FET has a gate biased by the relatively low voltage power supply, and an N channel.

4. An interface circuit as set forth in claim 3 further comprising a current sinking FET having a gate connected to the output of said inverter circuit and a channel connected between ground and each of said first and second I/O ports to sink load current when either of said digital circuits outputs a binary zero voltage.

5. An interface circuit as set forth in claim 2 wherein said inverter circuit comprises a P-Channel FET and an N-Channel FET having gates which are connected to one another and to said second I/O port, and channels which are connected in series, the output of said inverter circuit being located at the junction of said FET channels of the FETs within said inverter circuit.

6. An interface circuit as set forth in claim 1 wherein said first and second I/O ports are including means for coupling to said first and second digital circuits, respectively, via first and second transmission lines, respectively.

7. An interface circuit as set forth in claim 1 wherein said latching circuit means comprises an FET having a channel connected between said relatively high voltage power supply and said second I/O port, and a gate coupled to said second I/O port.

8. An interface circuit as set forth in claim 1 wherein the channel of said first FET is connected directly to said first and second I/O ports.

9. An interface circuit as set forth in claim 1 further comprising a first transmission line connected to said first I/O port and a second transmission line connected to said second I/O port.

10. An interface circuit as set forth in claim 9 wherein an on-resistance of said channel of said first FET is substantially less than the characteristic impedance of said first transmission line and said second transmission line.

11. A bidirectional communication system comprising:
   a first digital circuit operating at a relatively low power supply voltage and having a first I/O port;
   a second digital circuit operating at a relatively high power supply voltage and having a second I/O port;
   a first transmission line connected at one end to said first I/O port;
   a second transmission line connected at one end to said second I/O port; and a bidirectional level shifting interface circuit comprising:
a third I/O port connected to the other end of said first transmission line;
a fourth I/O port connected to the other end of said second transmission line;
an FET having a channel connected between said third and fourth I/O ports; and
latching circuit means, biased by the relatively high voltage power supply, having an output connected to said fourth I/O port, and a control input responsive to the voltage at said third or fourth I/O ports for latching said fourth I/O port at sufficient voltage to drive said second digital circuit at binary one voltage in response to the transmission by said first digital circuit of a binary one signal toward said second digital circuit via said third and fourth I/O ports.

12. A communication system as set forth in claim 11 wherein
said first digital circuit comprises a first transceiver connected to said first I/O port, said first transceiver comprising a first transmitter, a first receiver, and first means for disabling said first transmitter during reception by said first receiver, said first transmitter when disabled exhibiting a substantially higher output impedance than when enabled to prevent loading of communication signals received by said first receiver; and
said second digital circuit comprising a second transceiver connected to said second I/O port, said second transceiver comprising a second transmitter, a second receiver, and second means for disabling said second transmitter during reception by said second receiver, said second transmitter exhibiting a substantially higher output impedance when disabled than when enabled to prevent loading of communication signals received by said second receiver.

13. A communication system as set forth in claim 12 wherein said first transmitter of said first digital circuit exhibits an output impedance when enabled which output impedance is substantially less than a characteristic impedance of said first transmission line.

14. A communication system as set forth in claim 13 wherein said second transmitter of said second digital circuit exhibits an output impedance when enabled which output impedance is substantially greater that the output impedance exhibited by said first transmitter of said first digital circuit when enabled.

15. A system as set forth in claim 12
wherein said latching circuit means of said interface circuit comprises a P Channel FET, and said control input is located at a gate of said P Channel FET, and
said interface circuit further comprises an inverter circuit having a control input connected to said fourth I/O port, and an inverted output connected to said control input of said latching circuit means such that when said fourth I/O port exhibits a voltage greater then a threshold voltage of said inverter circuit caused by a binary one signal transmitted by said first digital circuit, said inverted output exhibits a binary zero voltage to activate said P Channel FET to latch said fourth I/O port at sufficient voltage to drive said second digital circuit at binary one voltage.

16. A system as set forth in claim 11 wherein said FET has a gate biased by the relatively low voltage power supply, and an N Channel.

17. A system as set forth in claim 15 wherein said interface circuit further comprises a current sinking FET having a gate connected to the output of said inverter circuit and a channel connected between said third I/O port and ground to sink load current when one of said digital circuits outputs a binary zero voltage.

18. A system as set forth in claim 15 wherein said inverter circuit comprises a P-Channel FET and an N-Channel FET having gates which are connected to one another and to said fourth I/O port, and channels which are connected in series, the output of said inverter circuit being located at the junction of said FET channels of the FETs within said inverter circuit.

19. An interface circuit as set forth in claim 11 wherein the channel of said FET is connected directly to said third and fourth I/O ports.

20. An interface circuit as set forth in claim 19 wherein an on-resistance of said channel of said FET is substantially less than a characteristic impedance of said first transmission line and said second transmission line.

21. A bidirectional communication system as set forth in claim 11 wherein:
said first digital circuit comprises a transmitter having an output connected to said first I/O port, and
said second digital circuit comprises a receiver having an input connected to said second I/O port, said receiver exhibiting a substantially higher input impedance than a characteristic impedance of said second transmission line such that when said transmitter transmits a binary one signal to said receiver via said first, third, fourth and second I/O ports and said first and second transmission lines, the voltage of said binary one signal increases at the input of said receiver to exceed a threshold voltage of said receiver, the voltage of the binary one signal transmitted from said transmitter along said second transmission line being less than said threshold voltage before said increase at the input of said receiver, said binary one signal causing a reflection at the input of said receiver, said reflection activating said control input of said latching circuit means to latch said forth I/O port at sufficient voltage to drive said second digital circuit at binary one voltage.

* * * * *